United States Patent
Jo et al.

(10) Patent No.: US 9,236,259 B2
(45) Date of Patent: Jan. 12, 2016

(54) METHOD OF MANUFACTURING SEMICONDUCTOR DEVICE HAVING DOPED LAYER

(71) Applicant: Samsung Electronics Co., Ltd., Suwon-Si, Gyeonggi-Do (KR)

(72) Inventors: Eun-Young Jo, Seoul (KR); Jong-Hoon Kang, Seoul (KR); Tae-Gon Kim, Seoul (KR); Han-Mei Choi, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/276,213

(22) Filed: May 13, 2014

(65) Prior Publication Data
US 2014/0357071 A1    Dec. 4, 2014

(30) Foreign Application Priority Data
May 28, 2013   (KR) .................. 10-2013-0060504

(51) Int. Cl.
*H01L 21/28* (2006.01)
*H01L 21/225* (2006.01)
*H01L 21/8238* (2006.01)
*H01L 29/66* (2006.01)

(52) U.S. Cl.
CPC ...... *H01L 21/28035* (2013.01); *H01L 21/2255* (2013.01); *H01L 21/28061* (2013.01); *H01L 21/823842* (2013.01); *H01L 29/66575* (2013.01)

(58) Field of Classification Search
CPC .... H01L 29/66545; H01L 21/38; H01L 21/22
USPC ................ 438/199, 587, 585, 562, 561, 559; 257/316
See application file for complete search history.

(56) References Cited

U.S. PATENT DOCUMENTS

| | | | |
|---|---|---|---|
| 7,026,219 B2 * | 4/2006 | Pomarede et al. | 438/285 |
| 7,964,918 B2 * | 6/2011 | Kanegae et al. | 257/369 |
| 8,173,499 B2 * | 5/2012 | Chung et al. | 438/199 |
| 8,580,664 B2 * | 11/2013 | Clark | 438/558 |
| 2006/0115967 A1 * | 6/2006 | Park et al. | 438/514 |
| 2008/0057644 A1 * | 3/2008 | Kwak et al. | 438/257 |
| 2008/0176387 A1 * | 7/2008 | Kang et al. | 438/513 |
| 2009/0035909 A1 * | 2/2009 | Chang et al. | 438/276 |
| 2010/0035425 A1 * | 2/2010 | Ryu et al. | 438/595 |
| 2010/0129968 A1 * | 5/2010 | Li et al. | 438/154 |
| 2011/0129990 A1 | 6/2011 | Mandrekar et al. | |

* cited by examiner

*Primary Examiner* — Mohammad Islam
*Assistant Examiner* — Chi-Hua Yang
(74) *Attorney, Agent, or Firm* — Harness, Dickey & Pierce, P.L.C.

(57) ABSTRACT

A method of manufacturing a semiconductor device having a doped layer may be provided. The method includes providing a substrate having a first region and a second region, forming a gate dielectric layer on the substrate, forming a first gate electrode layer on the gate dielectric layer, forming a first doped layer on the first gate electrode layer, forming a first capping layer on the first doped layer, forming a mask pattern on the first capping layer in the first region, the mask pattern exposing the first capping layer in the second region, removing the first capping layer and the first doped layer in the second region, removing the mask pattern, and forming a second doped layer on the first capping layer in the first region and the first gate electrode layer in the second region.

21 Claims, 10 Drawing Sheets

METHOD OF MANUFACTURING SEMICONDUCTOR DEVICE HAVING DOPED LAYER

CROSS-REFERENCE TO RELATED APPLICATIONS

This U.S. non-provisional patent application claims priority under 35 U.S.C. §119 to Korean Patent Application No. 10-2013-0060504, filed on May 28, 2013, in the Korean Intellectual Property Office (KIPO), the contents of which are herein incorporated by reference in their entirety.

BACKGROUND

1. Field

An aspect of the present inventive concepts herein relates to a method of manufacturing a semiconductor device having a doped layer comprising at least one of n-type and p-type impurities. The n-type or p-type impurities may be diffused into a gate electrode layer by performing an additional process, e.g., a heat treatment process.

2. Description of the Related Art

Responding to the growing demands for miniaturization of a semiconductor device, conductive lines, e.g., word lines or bit lines, formed in the semiconductor device have been downsized and the space between the conductive lines has been narrowed. Thus, a parasitic capacitance may increase between the conductive lines.

In order to reduce the parasitic capacitance, research activities have been focused on reducing the thickness of the gate electrode layer, which is formed on a gate dielectric layer and forms a portion of the word lines. However, if the thickness of the gate electrode layer is thinner than a certain thickness, it may cause some problems when injecting n-type or p-type impurities into the gate electrode layer by using an ion implantation process.

Specifically, if the thickness of the gate electrode layer is thinner than a certain thickness, it may be very difficult to control the distribution and/or the injection depth of the impurities, which are injected by the ion implantation process, in the gate electrode layer. The reliability of the gate dielectric layer also may be degraded because relatively more impurities may be injected into the gate dielectric layer through the gate electrode layer. If the energy of the ion implantation process is reduced to control the distribution and the injection depth of the impurities, process time of the ion implantation process may be prolonged, thereby hampering productivity.

SUMMARY

An aspect of the present inventive concepts provides a semiconductor device having a doped layer.

In one example embodiment, a method of manufacturing a semiconductor device includes providing a substrate having a first region and a second region, forming a gate dielectric layer on the substrate, forming a first gate electrode layer on the gate dielectric layer, forming a first doped layer on the first gate electrode layer, forming a first capping layer on the first doped layer, forming a mask pattern on the first capping layer in the first region, the mask pattern exposing the first capping layer in the second region, removing a portion of the first capping layer and the first doped layer formed in the second region, and forming a second doped layer on the first gate electrode layer in the second region.

The substrate may have a cell array region and a peripheral circuit region. The first and second regions may be formed in the peripheral circuit region.

The first doped layer may include a first silicon oxide layer having n-type impurities, and the second doped layer may include a second silicon oxide layer having p-type impurities.

The first and second doped layers may have a thickness of about 3 to about 20 nm, respectively.

At least one of the first and second doped layers may be formed by an atomic layer deposition (ALD) process.

The first doped layer may be formed by the ALD process, which includes at least five steps. The five steps may include a first step of injecting a phosphorus source gas into the chamber, a second step of purging the phosphorus source gas from the chamber, a third step of injecting an oxygen source gas into the chamber, a fourth step of purging the oxygen source gas from the chamber, and a fifth step of injecting a silicon source gas into the chamber.

The second doped layer may be formed by the ALD process, which includes at least five steps. The five steps may include a first step of injecting a boron source gas into the chamber, a second step of purging the boron source gas from the chamber, a third step of injecting an oxygen source gas into the chamber, a fourth step of purging the oxygen source gas from the chamber, and a fifth step of injecting a silicon source gas into the chamber.

The ALD process may be performed in a temperature range of from about 200 to about 500° C.

The method may further include forming a second capping layer on the second doped layer, and performing a heat treatment process.

At least one of the first and second capping layers may include a silicon oxide layer. The silicon oxide layer may include a silicon dioxide layer.

The heat treatment process may be performed in a temperature range of from about 900 to about 1100° C. and in a time range of from 1 to 30 sec.

The first doped layer may have n-type impurities and the second doped layer may have p-type impurities. While performing the heat treatment process, the n-type impurities may be diffused to the first gate electrode layer in the first region and the p-type impurities may be diffused to the first gate electrode layer in the second region.

The method may further include removing the second capping layer, the second doped layer, the first capping layer, and the first doped layer after performing the heat treatment process, and forming a second gate electrode layer on the first gate electrode layer.

The second capping layer, the second doped layer, the first capping layer, and the first doped layer may be removed by using a chemical solution including hydrofluoric acid.

The first gate electrode layer may include polycrystalline silicon and the second gate electrode layer may include at least one of tungsten (W) and tungsten silicide (WSix).

The first doped layer may be formed by an ALD process and the second doped layer may be formed by a chemical vapor deposition (CVD) process.

The ALD process may be performed in a first temperature range and the CVD process may be performed in a second temperature range. The second temperature range may be higher than the first temperature range.

The first doped layer may have n-type impurities and the second doped layer may have p-type impurities. While forming the second doped layer by using a chemical vapor deposition (CVD) process, the n-type impurities may be diffused to the first gate electrode layer in the first region and the p-type impurities may be diffused to the first gate electrode layer in the second region.

The method may further include removing the second doped layer, the first capping layer, and the first doped layer after forming the second doped layer by using the CVD process, and forming the second gate electrode layer on the first gate electrode layer.

In another example embodiment of the inventive concepts, a method of manufacturing a semiconductor device includes providing a substrate having a first region and a second region, forming a gate dielectric layer on the substrate, forming a first gate electrode layer on the gate dielectric layer, forming a first doped layer on the first gate electrode layer, forming a first capping layer on the first doped layer, forming a mask pattern on the first capping layer in the first region, the mask pattern exposing the first capping layer in the second region, removing a portion of the first capping layer and the first doped layer formed in the second region, removing the mask pattern, and forming a second doped layer on the first capping layer in the first region and the first gate electrode layer in the second region.

In still another example embodiment of the inventive concepts, a method of manufacturing a semiconductor device includes selectively removing a capping layer and a first doped layer formed over a semiconductor substrate, the semiconductor substrate having a first region and a second region, the doped layer being on an electrode layer, and the removing removing the capping layer and the first doped layer over the second region; and forming a second doped layer on the first capping layer in the first region and on the electrode layer in the second region The first doped layer may include one of n-type and p-type impurities and the second doped layer may include the other of n-type and p-type impurities.

The method may further include performing a heat treatment after the forming the second doped layer to diffuse impurities to the gate electrode layer.

BRIEF DESCRIPTION OF THE DRAWINGS

The foregoing and other features and advantages of the inventive concepts will be apparent from the more particular description of the example embodiments, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF EXAMPLE EMBODIMENTS

Figure 1:
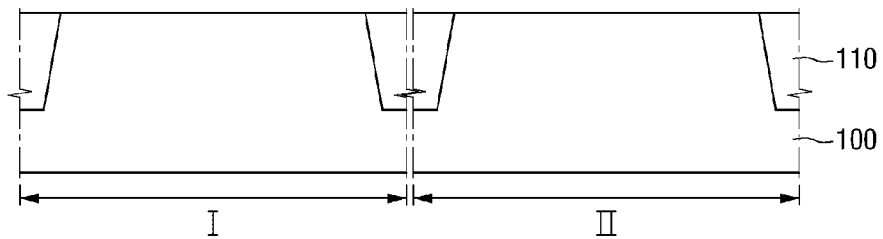
FIGS. 1 through 11 are cross-sectional views illustrating a method of manufacturing a semiconductor device according to an example embodiment of the inventive concepts.

Example embodiments of the inventive concepts will now be described more fully hereinafter with reference to the accompanying drawings; however, they may be embodied in different forms and should not be construed as limited to the example embodiments set forth herein. Rather, these example embodiments are provided so that this disclosure will be thorough and complete, and will fully convey the scope of the inventive concepts to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or example terms provided herein is intended merely to better illuminate the example embodiments and is not a limitation on the scope of the inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Hereinafter, example embodiments of the inventive concepts will be described in detail with reference to the accompanying drawings.

FIGS. 1 through 11 are cross-sectional views illustrating a method of manufacturing a semiconductor device according to an example embodiment of the inventive concepts.

Referring to FIG. 1, a substrate 100 having a first region I and a second region II may be provided. The substrate 100 may comprise a rigid substrate, e.g., a bulk silicon substrate, a silicon-on-insulator (SOI) substrate, a germanium substrate, a silicon germanium substrate, an indium antimonide substrate, a lead telluride substrate, an indium arsenide substrate, an indium phosphorus substrate, a gallium arsenide substrate, or an antimony gallium substrate.

The substrate 100 may include a cell array region and a peripheral circuit region. The first and second regions I and II may be formed in the peripheral region. The first and second regions I and II may have different electrical characteristics, for example, the first region I may be a NMOS transistor region and the second region II may be a PMOS transistor region.

The substrate 100 may include a device isolation region 110 that may be formed by, e.g., a shallow-trench-isolation (STI) process. The device isolation region 110 may include, e.g., a silicon oxide layer formed by a high-density-plasma (HDP) process or a flowable-chemical-vapor-deposition (FCVD) process. The device isolation region 110 may be formed at the boundary of the first region I and the second region II. The device isolation region 110 may be also formed in the first region I and the second region II, respectively.

Figure 2:
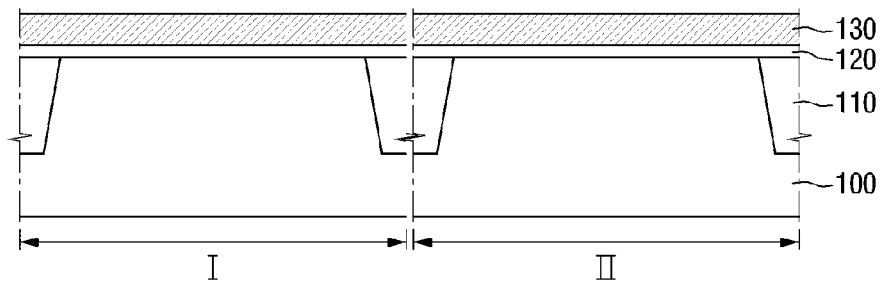

Referring to FIG. 2, a gate dielectric layer 120 may be formed on the substrate 100. The gate dielectric layer 120 may be formed by, e.g., a thermal oxidation process, an atomic layer deposition (ALD) process, or a chemical vapor deposition (CVD) process. The gate dielectric layer 120 may include a silicon oxide layer. The silicon oxide layer may include a silicon dioxide ($SiO_2$) layer. The gate dielectric layer 120 may also include a high-k dielectric layer comprising at least one high-k material, e.g., hafnium (Hf) or zirconium (Zr).

A first gate electrode layer 130 may be formed on the gate dielectric layer 120. The first gate electrode layer 130 may comprise a polysilicon layer that may be formed by a CVD method and have a thickness of 5 to 40 nm.

Figure 3:
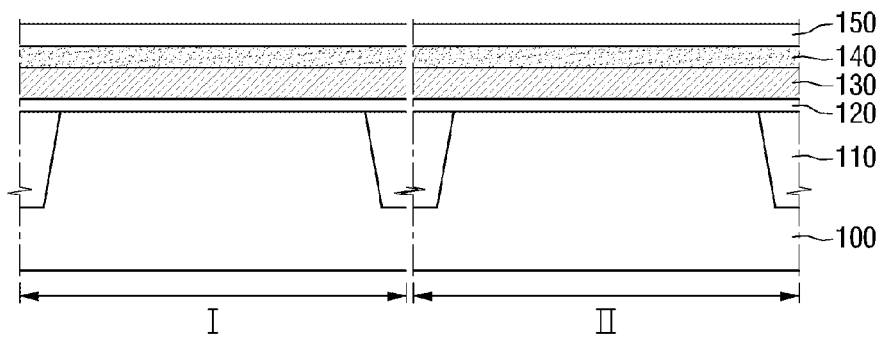

Referring to FIG. 3, a first doped layer 140 may be formed on the gate electrode layer 130 in a chamber. The first doped layer 140 may comprise an oxide layer having n-type impurities, e.g., phosphorus (Ph) or arsenic (As). The first doped layer 140 may include a phosphorus pentoxide ($P_2O_5$) layer or phosphorus-doped silicon oxide layer, and have a thickness of 3 to 20 nm. The first doped layer 140 may be formed by an ALD process and in a temperature range of from 200 to 500° C. The ALD process may comprise a series of processes having at least five steps, which include: a first step of injecting a phosphorus source gas into the chamber; a second step of purging the phosphorus source gas from the chamber; a third step of injecting an oxygen source gas into the chamber; a fourth step of purging the oxygen source gas from the chamber; and a fifth step of injecting a silicon source gas into the chamber.

A first capping layer 150 may be formed on the first doped layer. The first capping layer 150 may comprise silicon oxide.

Figure 4:
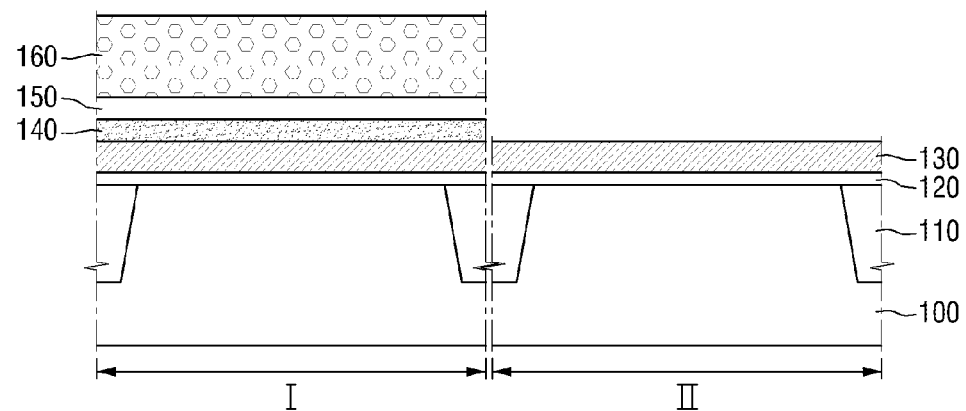

Referring to FIG. 4, a mask pattern 160 may be formed on the first capping layer in the first region I to expose the first capping layer in the second region II. The mask pattern 160 may include, e.g., at least one of a photoresist layer and a silicon nitride (SiN) layer.

The first capping layer 150 and the first doped layer 140 in the second region II may be removed to expose an upper surface of the first gate electrode layer 130 in the second region II. The first capping layer 150 and the first doped layer 140 in the second region II may be removed by a wet etching process using a diluted hydrofluoric acid (HF) or a dry etching process using at least one etching gas.

Figure 5:
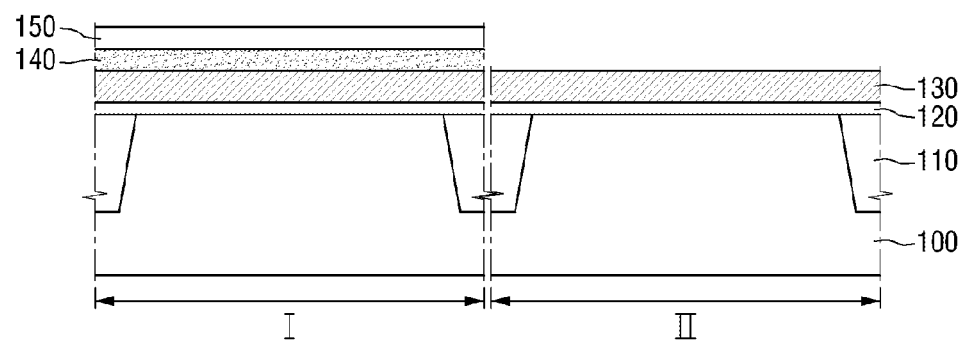

Referring to FIG. 5, the mask pattern 160 may be removed. If the mask pattern 160 is formed of a photoresist layer, it may be removed by an ashing or a stripping process.

Figure 6:
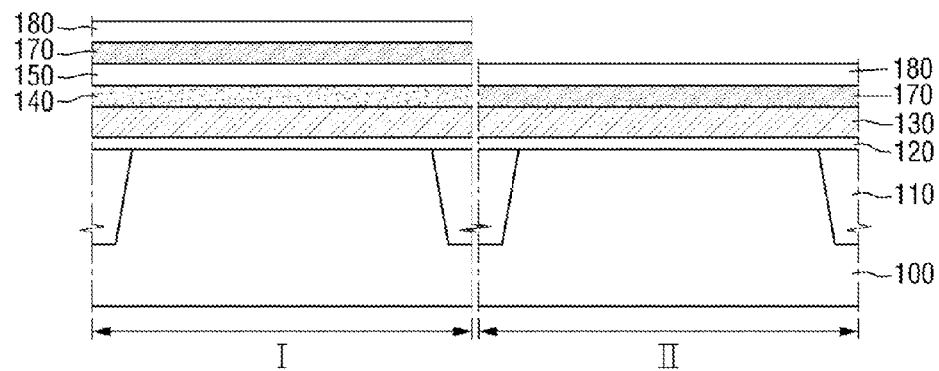

Referring to FIG. 6, a second doped layer 170 may be formed on the first capping layer 150 in the first region I and the first gate electrode layer 130 in the second region II. The second doped layer 170 may comprise an oxide layer having p-type impurities, e.g., boron (B) or boron difluoride ($BF_2$). The second doped layer 170 may include a boron trioxide ($B_2O_3$) layer or a boron-doped silicon oxide layer, and have a thickness of 3 to 20 nm. The second doped layer 170 may be formed by an ALD process in a chamber and in a temperature range of from 200 to 500° C. The ALD process may comprise a series of processes having at least five steps, which includes: a first step of injecting a boron source gas into the chamber; a second step of purging the boron source gas from the chamber; a third step of injecting an oxygen source gas into the chamber; a fourth step of purging the oxygen source gas from the chamber; and a fifth step of injecting a silicon source gas into the chamber.

A second capping layer 180 may be formed on the second doped layer 170. The second capping layer 180 may comprise a silicon oxide layer.

Figure 7:
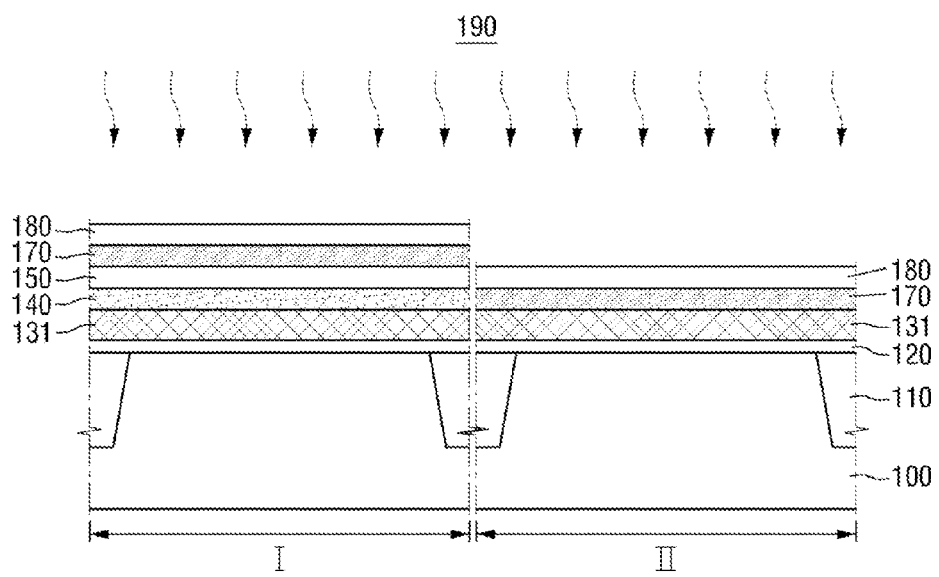

Referring to FIG. 7, a heat treatment process 190 may be performed, for instance, in a temperature range of from 900 to 1100° C. and a time range of from 1 to 30 seconds after forming the second capping layer 180. The n-type impurities may be diffused to the first gate electrode layer 130 in the first region I and the p-type impurities may be diffused to the first gate electrode layer 130 in the second region II during the heat treatment process 190. During the heat treatment process, the first capping layer 150 may prevent (or minimize) the p-type impurities which is included in the second doped layer 170 from injecting into the first gate electrode layer 130 in the first region I and the second capping layer 180 may help the p-type impurities included in the second doped layer 170 inject into the first gate electrode layer 130 in the second region II without going outside. The first gate electrode layer 130 may be referred to as a first doped gate electrode layer 131 after the heat treatment process 190.

In comparison with an ion implantation process, if the n-type and the p-type impurities are injected into the first gate electrode layer 130 by the heat treatment process 190, the impurities may be more uniformly distributed in the first gate electrode layer 130 and/or cause less damage in the gate dielectric layer 120.

Further, injecting impurities using the ion implantation process may use two mask patterns, e.g., a first mask pattern to cover the first region I and a second mask pattern to cover the second region II. By contrast, injecting impurities using the heat treatment process 190 may use only one mask pattern thereby reducing at least one photolithography step.

Figure 8:
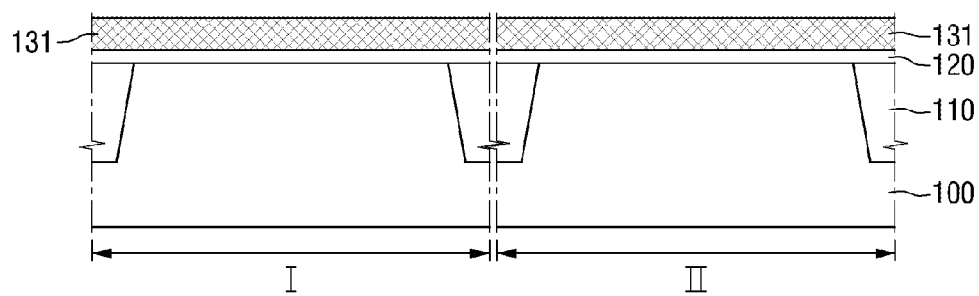

Referring to FIG. 8, the first doped gate electrode layer 131 may be exposed by removing the second capping layer 180, the second doped layer 170, the first capping layer 150, and the first doped layer 140. The second capping layer 180, the second doped layer 170, the first capping layer 150, and the first doped layer 140 may be removed by a wet etching process or a dry etching process. Using a wet etching process may be better than using a dry etching process in terms of reducing damage at the upper surface of the first doped gate electrode layer 131. The wet etching process may be performed by, e.g., using a diluted hydrofluoric acid (HF).

Figure 9:
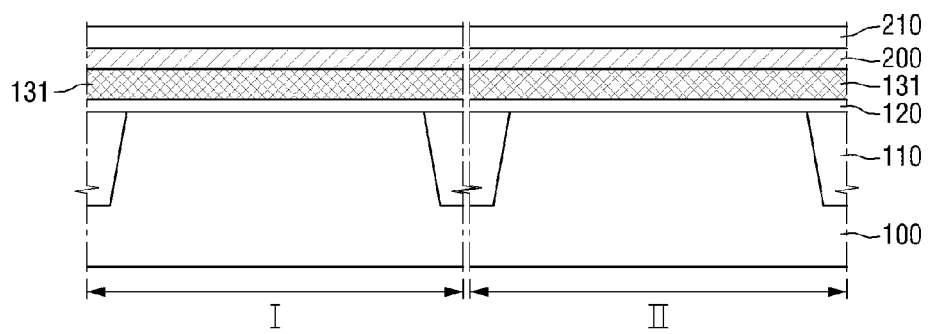

Referring to FIG. 9, a second gate electrode layer 200 may be formed on the first doped gate electrode layer 131. The second gate electrode layer 200 may be formed of a single layer or a multilayer, which may include at least one of a tungsten (W) layer and a tungsten silicide (WSix) layer. A gate hard mask layer 210 may be formed on the second gate electrode layer 200. The gate hard mask layer 210 may include at least one of silicon nitride (SiN), silicon oxynitride (SiON), and silicon dioxide ($SiO_2$).

Figure 10:
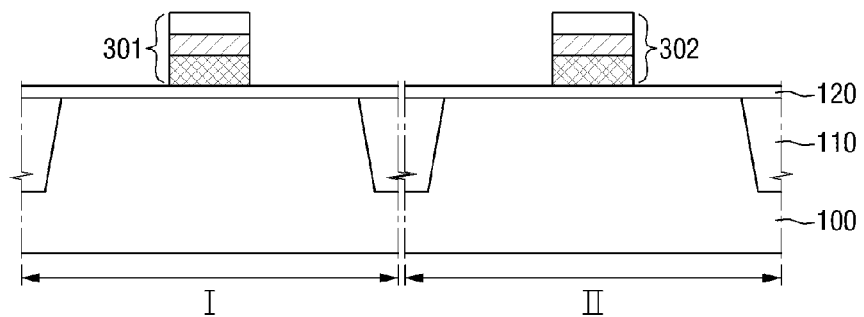

Referring to FIG. 10, first and a second gate electrode patterns 301 and 302 may be formed in the first and second regions I and II, respectively. The first and second gate electrode patterns 301 and 302 may have respective sidewalls, which may be formed by using a photolithography process and an etching process.

Figure 11:
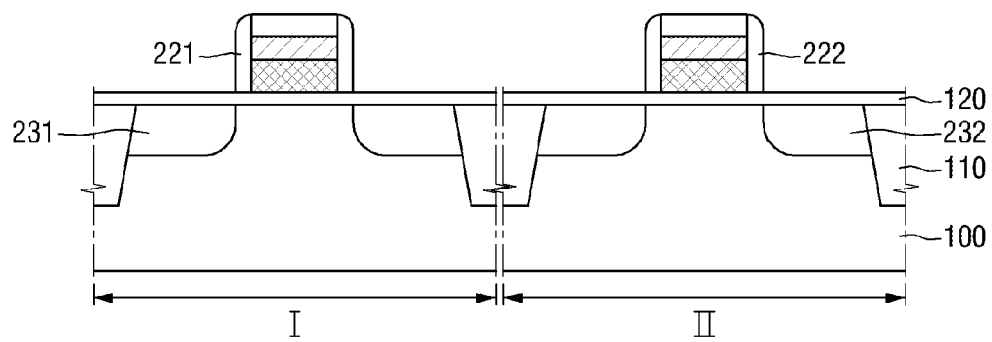

Referring to FIG. 11, a first gate spacer 221 may be formed on the sidewalls of the first gate electrode pattern 301, and a second gate spacer 222 may be formed on the sidewalls of the second gate electrode pattern 302. The first and second gate spacers 221 and 222 may include at least one of silicon nitride (SiN), silicon oxynitride (SiON), and silicon dioxide ($SiO_2$).

A first source/drain region 231 may be formed in the substrate 100 at both sides of the first gate electrode pattern 301, and a second source/drain region 232 may be formed in the substrate 100 at both sides of the second gate electrode pattern 302. The first source/drain region 231 may be formed by injecting n-type impurities, e.g., phosphorus (Ph) or arsenic (As), into the substrate 100 using an ion implantation process. The second source/drain region 232 may be formed by injecting p-type impurities, e.g., boron (B) or boron difluoride ($BF_2$), into the substrate 100 using an ion implantation process.

After forming the first and second source/drain regions 231 and 232, further processes, e.g., a process for forming an interlayer dielectric layer, a process for forming an interconnection including contact plugs and bit lines, etc., may be performed to complete a method of manufacturing a semiconductor device according to an example embodiment of the inventive concepts.

FIGS. FIGS. 12 through 16 are cross-sectional views illustrating a method of manufacturing a semiconductor device according to another example embodiment of the inventive concepts. Because this example embodiment performs the same or substantially similar processes as illustrated in FIGS. 1 through 5, only differences from the previous example embodiment will be explained in detail with respect to FIGS. 12 through 16.

Figure 12:
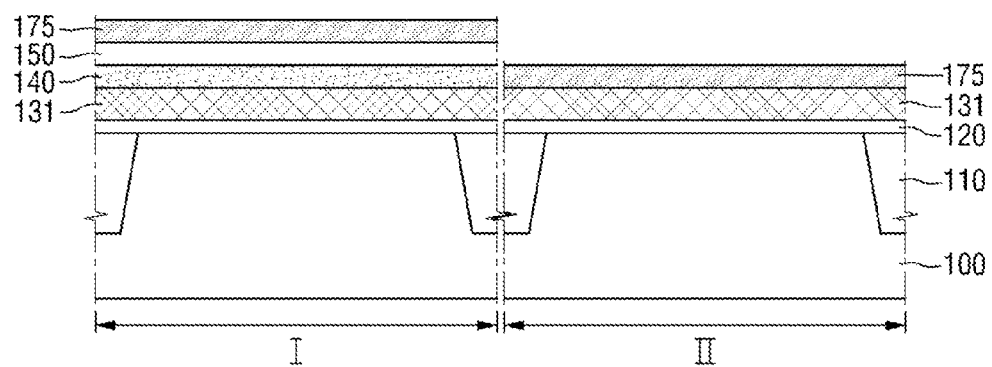
FIGS. 12 through 16 are cross-sectional views illustrating a method of manufacturing a semiconductor device according to another example embodiment of the inventive concepts.

Referring to FIG. 12, a second doped layer 175 may be formed on the first capping layer 150 in the first region I and the first gate electrode layer 130 in the second region II. The second doped layer 175 may comprise an oxide layer having p-type impurities, e.g., boron (B) or boron difluoride ($BF_2$). The second doped layer 175 may include a boron trioxide ($B_2O_3$) layer or a boron-doped silicon oxide layer, and have a thickness of 3 to 20 nm. The second doped layer 175 may be formed by, for instance, a CVD process in a chamber and in a temperature range of from 500 to 900° C.

While the second doped layer 175 is formed by the CVD process, the n-type impurities may be diffused to the first gate electrode layer 130 in the first region I, and the p-type impurities may be diffused to the first gate electrode layer 130 in the second region II simultaneously. The first gate electrode layer 130 may be referred to as a first doped gate electrode layer 131 after forming the second doped layer 175 by the CVD process. At this moment, the first capping layer 150 may prevent (or minimize) the p-type impurities included in the second doped layer 175 from injecting into the first gate electrode layer 130 in the first region I.

Because the CVD process forming the second doped layer 175 is performed at a higher temperature range than the ALD process, the heat treatment process 190 mentioned in the previous embodiment may be omitted.

In comparison with an ion implantation process, if the n-type or p-type impurities are injected into the first gate electrode layer 130 during the CVD process forming the second doped layer 175, the n-type and the p-type impurities may be more uniformly distributed in the first gate electrode layer 130 and/or cause less damage, in the gate dielectric layer 120.

Figure 13:
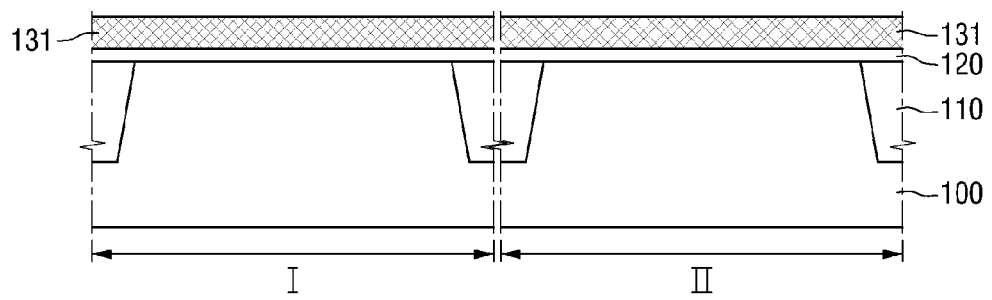

Referring to FIG. 13, the first doped gate electrode layer 131 may be exposed by removing the second doped layer 175, the first capping layer 150, and the first doped layer 140. The second doped layer 175, the first capping layer 150, and the first doped layer 140 may be removed by a wet etching process or a dry etching process. Using a wet etching process may be better than using a dry etching process in terms of reducing damage at the upper surface of the first doped gate electrode layer 131. The wet etching process may be performed by, e.g., using a diluted hydrofluoric acid (HF).

Figure 14:
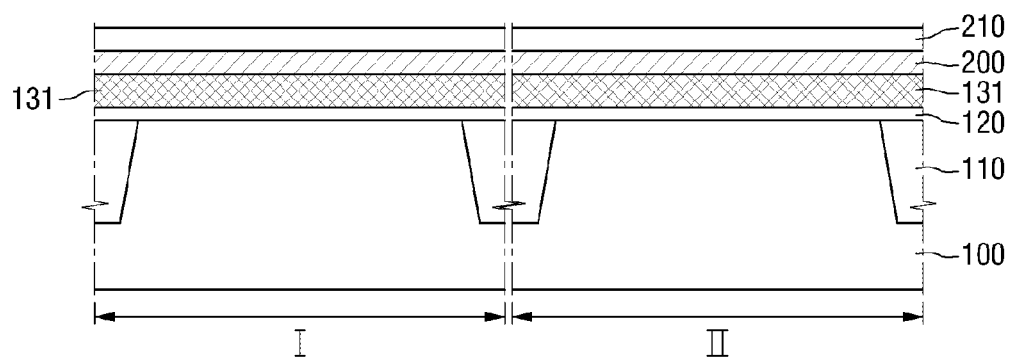

Referring to FIG. 14, a second gate electrode layer 200 may be formed on the first doped gate electrode layer 131. The second gate electrode layer 200 may be formed of a single layer or a multilayer, which may include at least one of a tungsten (W) layer and a tungsten silicide (WSix) layer. A gate hard mask layer 210 may be formed on the second gate electrode layer 200. The gate hard mask layer 210 may include at least of silicon nitride (SiN), silicon oxynitride (SiON), and silicon dioxide ($SiO_2$).

Figure 15:
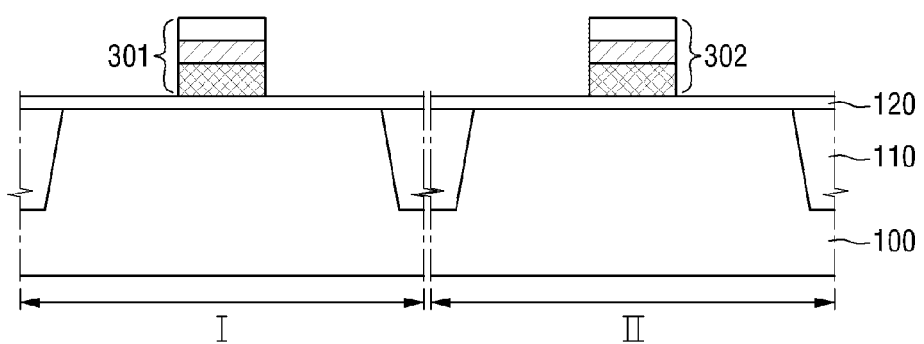

Referring to FIG. 15, first and second gate electrode patterns 301 and 302 may be formed in the first and second region I and II, respectively. The first and second gate electrode patterns 301 and 302 may have respective sidewalls, which may be formed by using a photolithography process and an etching process.

Figure 16:
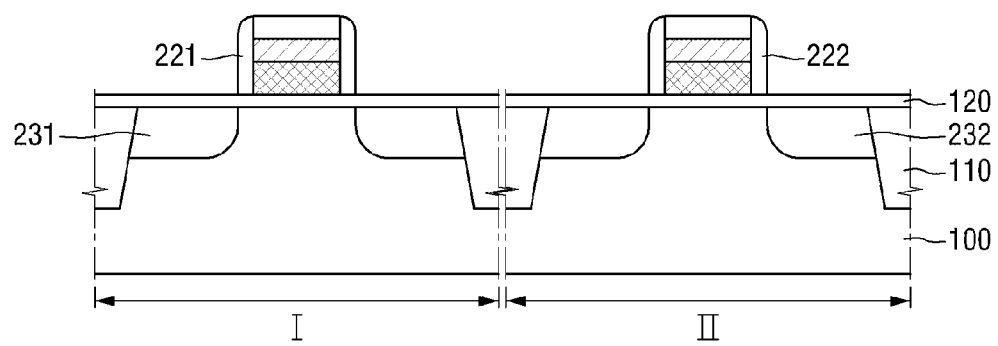

Referring to FIG. 16, a first gate spacer 221 may be formed on the sidewalls of the first gate electrode pattern 301 and a second gate spacer 222 may be formed on the sidewalls of the second gate electrode pattern 302. The first and second gate spacers 221 and 222 may include at least one of silicon nitride (SiN), silicon oxynitride (SiON), and silicon dioxide ($SiO_2$).

A first source/drain region 231 may be formed in the substrate 100 at both sides of the first gate electrode pattern 301 and a second source/drain region 232 may be formed in the substrate 100 at both sides of the second gate electrode pattern 302. The first source/drain region 231 may be formed by injecting n-type impurities, e.g., phosphorus (Ph) or arsenic (As), into the substrate 100 using an ion implantation process. The second source/drain region 232 may be formed by injecting p-type impurities, e.g., boron (B) or boron difluoride ($BF_2$), into the substrate 100 using an ion implantation process.

After forming the first and second source/drain region 231 and 232, further processes, e.g., a process for forming an interlayer dielectric layer, a process for forming an interconnection including contact plugs and bit lines, etc., may be performed to complete a method of manufacturing a semiconductor device according to an example embodiment of the inventive concepts.

Figure 17:
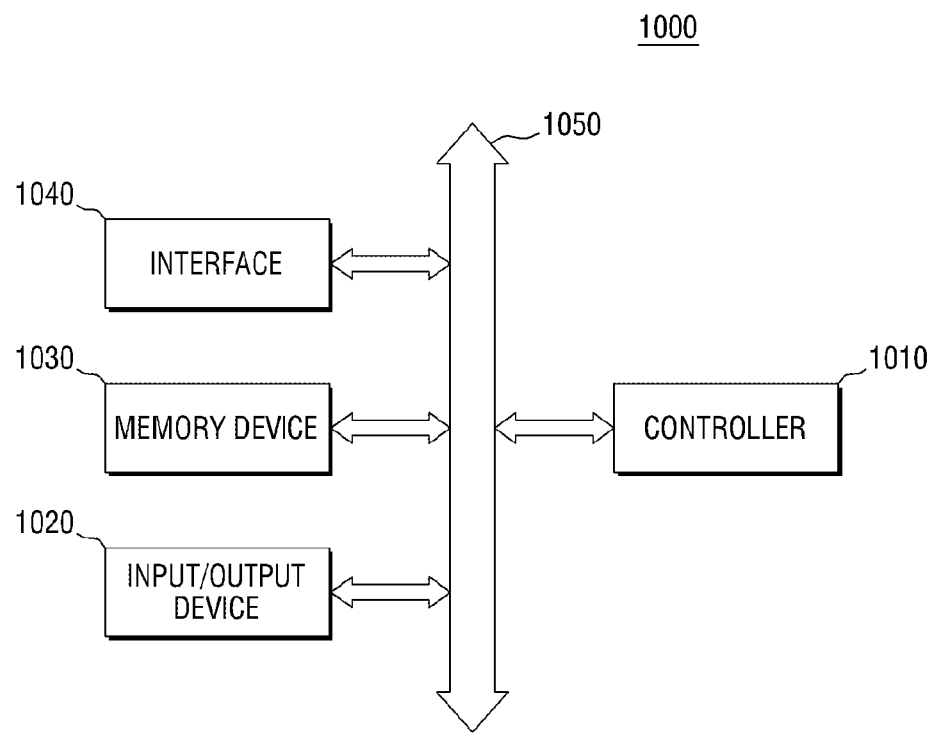
FIG. 17 is a schematic system view including a semiconductor device according to an example embodiment of the inventive concepts.

FIG. 17 is a block diagram of a system 1000 including a semiconductor device manufactured according to an example embodiment of the inventive concepts. The system 1000 may comprise a controller 1010, an input/output device 1020, a memory device 1030, and an interface 1040. The system 1000 may be a portion of a mobile system or a product that can transport information, e.g., a navigation system, a solid state disk, or a household appliance. The mobile system may comprise a PDA, a portable computer, a web tablet, a wireless phone, a mobile phone, a digital music player, or a memory card. The controller 1010 may comprise a microprocessor, a digital signal processor, a microcontroller, or a similar device that can control an executive program. The input/output device 1020 may comprise a keypad, a keyboard, or a display.

The memory device 1030 may not only save codes or data for executing the controller 1010 but also save data executed by the controller 1010. The memory device 1030 may comprise a semiconductor device, which is having a NMOS or PMOS transistor, according to an example embodiment of the inventive concepts, e.g., the memory device 1030 may comprise at least one semiconductor device disclosed in FIGS. 1 through 16.

The system 1000 may transport data to an external device through an interface 1040. The controller 1010, the input/output device 1020, the memory device 1030, and the interface 1040 may communicate with each other through a bus 1050.

Figure 18:
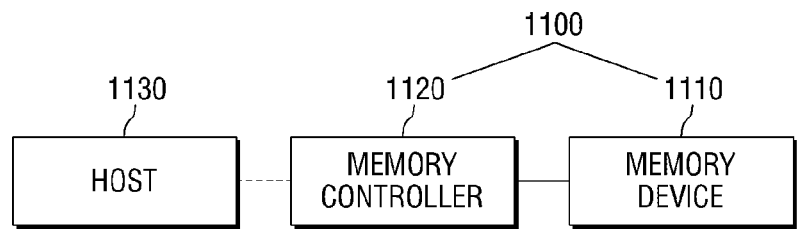
FIG. 18 is a memory card including a semiconductor device manufactured according to an example embodiment of the inventive concepts.

FIG. 18 is another block diagram illustrating a memory card 1100 including a semiconductor device manufactured according to an example embodiment of the inventive concepts. The memory card 1100 may comprise a memory device 1110 and a memory controller 1120. The memory device 1110 may include a DRAM, a FLASH, or a logic device which is manufactured according to an example embodiment of the inventive concepts. The memory controller 1120 may read/save data from/to the memory device 1110 by requesting from a host 1130. The memory controller 1120 may include at least one semiconductor device manufactured as illustrated in FIGS. 1 through 16.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A method of manufacturing a semiconductor device, the method comprising:
    providing a substrate having a first region and a second region;
    forming a gate dielectric layer on the substrate;
    forming a first gate electrode layer on the gate dielectric layer;
    forming a first doped layer on the first gate electrode layer;
    forming a first capping layer on the first doped layer;
    forming a mask pattern on the first capping layer in the first region, the mask pattern exposing the first capping layer in the second region;
    removing a portion of the first capping layer and the first doped layer formed in the second region;
    forming a second doped layer on the first gate electrode layer in the second region;
    forming a second capping layer on the second doped layer;
    performing a heat treatment process;
    removing the second capping layer, the second doped layer, the first capping layer, and the first doped layer after performing the heat treatment process; and
    forming a second gate electrode layer on the first gate electrode layer.

2. The method as claimed in claim 1, wherein the substrate has a cell array region and a peripheral circuit region; and the first and second regions are formed in the peripheral circuit region.

3. The method as claimed in claim 1, wherein
    the first doped layer includes a first silicon oxide layer having n-type impurities, and
    the second doped layer includes a second silicon oxide layer having p-type impurities.

4. The method as claimed in claim 1, wherein the first and second doped layers have a thickness of about 3 to about 20 nm, respectively.

5. The method as claimed in claim 1, wherein at least one of the first and second doped layers is formed by an atomic layer deposition (ALD) process.

6. The method as claimed in claim 5, wherein the first doped layer is formed by the ALD process, which includes at least five steps, and the at least five steps include,
    a first step of injecting a phosphorus source gas into the chamber,
    a second step of purging the phosphorus source gas from the chamber,
    a third step of injecting an oxygen source gas into the chamber,
    a fourth step of purging the oxygen source gas from the chamber, and
    a fifth step of injecting a silicon source gas into the chamber.

7. The method as claimed in claim 5, wherein the second doped layer is formed by the ALD process, which includes at least five steps, and the five steps include,
    a first step of injecting a boron source gas into the chamber,
    a second step of purging the boron source gas from the chamber,
    a third step of injecting an oxygen source gas into the chamber,
    a fourth step of purging the oxygen source gas from the chamber, and
    a fifth step of injecting a silicon source gas into the chamber.

8. The method as claimed in claim 5, wherein the ALD process is performed in a temperature range of from about 200 to about 500° C.

9. The method as claimed in claim 1, wherein at least one of the first and second capping layers include a silicon oxide layer.

10. The method as claimed in claim 1, wherein the heat treatment process is performed in a temperature range of from about 900 to about 1100° C. and in a time range of from 1 to 30 sec.

11. The method as claimed in claim 1, wherein the first doped layer has n-type impurities and the second doped layer has p-type impurities, and the n-type impurities are diffused to the first gate electrode layer in the first region and the p-type impurities are diffused to the first gate electrode layer in the second region while performing the heat treatment process.

12. The method as claimed in claim 1, wherein the removing the second capping layer, the second doped layer, the first capping layer, and the first doped layer is performed by using a chemical solution including hydrofluoric acid.

13. The method as claimed in claim 1, wherein the first gate electrode layer includes polycrystalline silicon, and the second gate electrode layer includes at least one of tungsten (W) and tungsten silicide (WSix).

14. The method as claimed in claim 1, wherein the forming a first doped layer forms the first doped layer by an ALD process and the forming a second doped layer forms the second doped layer by a chemical vapor deposition (CVD) process.

15. The method as claimed in claim 14, wherein the forming a first doped layer includes performing the ALD process at temperatures within a first temperature range, the forming a second doped layer includes performing the CVD process at temperatures within a second temperature range, and a maximum temperature of the second temperature range is higher than a maximum temperature of the first temperature range.

16. The method as claimed in claim 14, wherein the first doped layer has n-type impurities and the second doped layer has p-type impurities, and the n-type impurities are diffused to the first gate electrode layer in the first region and the p-type impurities are diffused to the first gate electrode layer in the second region while forming the second doped layer by using the CVD process.

17. The method as claimed in claim 14, further comprising:
    removing the second doped layer, the first capping layer, and the first doped layer after forming the second doped layer by using the CVD process; and
    forming the second gate electrode layer on the first gate electrode layer.

18. A method of manufacturing a semiconductor device, the method comprising:
    providing a semiconductor substrate having a first region and a second region;
    providing an electrode layer on the semiconductor substrate;
    providing a capping layer and a first doped layer on the electrode layer;
    selectively removing the capping layer and the first doped layer over the second region; and
    forming a second doped layer on the first capping layer in the first region and on the electrode layer in the second region;
    removing the second doped layer, the capping layer, the first doped layer; and
    forming electrode patterns by patterning the electrode layer exposed by the removing.

19. The method as claimed in claim 18, wherein the first doped layer includes one of n-type and p-type impurities and the second doped layer includes the other of n-type and p-type impurities.

20. The method as claimed in claim 19, further comprising:
    performing a heat treatment after the forming the second doped layer to diffuse impurities to the gate electrode layer.

21. A method of manufacturing a semiconductor device, the method comprising:
    providing a substrate having a first region and a second region;
    forming a gate dielectric layer on the substrate;
    forming a first gate electrode layer on the gate dielectric layer;
    forming a first doped layer on the first gate electrode layer;
    forming a first capping layer on the first doped layer;
    forming a mask pattern on the first capping layer in the first region, the mask pattern exposing the first capping layer in the second region;
    removing a portion of the first capping layer and the first doped layer formed in the second region;
    forming a second doped layer on the first gate electrode layer in the second region;
    forming a second capping layer on the second doped layer; and
    performing a heat treatment process against the first and second doped layers,
    wherein at least one of the first and second doped layers is formed by an atomic layer deposition (ALD) process.

* * * * *